(12) United States Patent
Yamane

(10) Patent No.: US 12,089,358 B2
(45) Date of Patent: Sep. 10, 2024

(54) POWER CONVERSION DEVICE

(71) Applicant: TMEIC Corporation, Chuo-ku (JP)

(72) Inventor: Keishi Yamane, Chuo-ku (JP)

(73) Assignee: TMEIC CORPORATION, Chuo-ku (JP)

( * ) Notice: Subject to any disclaimer, the term of this patent is extended or adjusted under 35 U.S.C. 154(b) by 202 days.

(21) Appl. No.: 17/784,550

(22) PCT Filed: Nov. 13, 2020

(86) PCT No.: PCT/JP2020/042492
§ 371 (c)(1),
(2) Date: Jun. 10, 2022

(87) PCT Pub. No.: WO2022/102097
PCT Pub. Date: May 19, 2022

(65) Prior Publication Data
US 2023/0020139 A1 Jan. 19, 2023

(51) Int. Cl.
*H05K 7/14* (2006.01)
*H02M 7/00* (2006.01)

(52) U.S. Cl.
CPC ........ *H05K 7/14325* (2022.08); *H02M 7/003* (2013.01); *H05K 7/1432* (2013.01); *H05K 7/14324* (2022.08)

(58) Field of Classification Search
CPC .. H05K 7/183; H05K 7/14325; H05K 7/1474; H05K 7/1432; H05K 7/14322; H05K 7/14324; H02M 7/003; H02M 7/05
(Continued)

(56) References Cited

U.S. PATENT DOCUMENTS 6,552,912 B1 * 4/2003 Kanazawa ......... H05K 7/14322
361/752
9,634,468 B2 * 4/2017 Gaumon .................. H02B 1/30
(Continued)

FOREIGN PATENT DOCUMENTS

EP 2 101 402 B1 2/2017
JP 2018207563 A * 12/2018
(Continued)

OTHER PUBLICATIONS

International Search Report issued Dec. 15, 2020, in PCT/JP2020/042492 filed Nov. 13, 2020, 3 pages.
(Continued)

*Primary Examiner* — Nidhi Thaker
(74) *Attorney, Agent, or Firm* — Oblon, McClelland, Maier & Neustadt, L.L.P.

(57) ABSTRACT

A capacitor unit includes: a base portion with a mount surface, and a locking member. The locking member includes a shaft portion to be inserted in a hole provided in the mount surface and a head portion. A first guide member and a second guide member guide along an anteroposterior direction, a first end and a second end of the base portion in a lateral direction, respectively. The hole is located between the capacitor and the first end in the lateral direction, and arranged at a position more distant from an opening than the first guide member in the anteroposterior direction. At a first engagement position, the locking member abuts on the first guide member. At a second engagement position, abutment of the locking member on the first guide member is canceled.

5 Claims, 10 Drawing Sheets

(58) Field of Classification Search
USPC .................................. 361/821, 622
See application file for complete search history.

(56) References Cited

U.S. PATENT DOCUMENTS

| | | | |
|---|---|---|---|
| 10,524,383 B2* | 12/2019 | Yoshikawa | H05K 7/1432 |
| 10,707,768 B2* | 7/2020 | Voegeli | H05K 7/1432 |
| 2016/0037677 A1* | 2/2016 | Yamanaka | H05K 7/20918 |
| | | | 361/697 |

FOREIGN PATENT DOCUMENTS

| | | | | |
|---|---|---|---|---|
| JP | 2019-13064 A | | 1/2019 | |
| WO | WO-2019222779 A1 * | | 11/2019 | ............ H02M 7/003 |

OTHER PUBLICATIONS

Indian Office Action, issued Apr. 1, 2024, in Indian Patent Application No. 202217032906, 5 pages.

* cited by examiner

POWER CONVERSION DEVICE

TECHNICAL FIELD

The present disclosure relates to a power conversion device.

BACKGROUND ART

Japanese Patent Laying-Open No. 2018-207563 (PTL 1) discloses a power conversion device in which a plurality of units are accommodated in the inside of a housing in a shape of a parallelepiped. The plurality of units include a plurality of power conversion devices and a capacitor unit in which a plurality of capacitors are accommodated. The plurality of power conversion devices and the capacitor unit are arranged along a vertical direction of the housing as being stacked in multiple tiers.

CITATION LIST

Patent Literature

PTL 1: Japanese Patent Laying-Open No. 2018-207563

SUMMARY OF INVENTION

Technical Problem

In the power conversion device described in PTL 1, in maintenance or replacement of the capacitor unit, the capacitor unit can be removed from the housing by drawing the capacitor unit forward through an opening provided in a front surface of the housing.

A wiring member, however, is connected to a terminal of each of the plurality of capacitors. Therefore, in order to remove the capacitor unit, works for removing the wiring member from the terminal of each capacitor are required. For a capacitor located on a deep side of the housing, works for removing the wiring member should inevitably be done while the capacitor unit is drawn forward through the opening, and there is a concern about drop of the capacitor unit from the housing during the works.

In order to prevent the capacitor unit from dropping, a method of accommodating the capacitor unit around a ceiling of the housing, doing works for removing the wiring member through the opening provided in the ceiling, and thereafter drawing the capacitor unit out of the housing can be adopted. With this method, however, a position of arrangement of the capacitor unit is restricted and a degree of freedom in arrangement of a plurality of units in the inside of the housing is lowered. Since the wiring member connected to the capacitor is longer in length due to arrangement of the capacitor unit around the ceiling, harmonic noise superimposed on a voltage or a current may increase.

The present disclosure was made to solve the problems above, and an object thereof is to provide a power conversion device capable of preventing a capacitor unit from dropping during works for removing the capacitor unit and capable of removing restrictions in arrangement of the capacitor unit within a housing.

Solution to Problem

A power conversion device according to one aspect of the present disclosure includes a capacitor unit and a housing. The housing is provided with an opening that opens toward the front, and the capacitor unit is removably accommodated in the housing through the opening. The housing includes a shelf, a first guide member, and a second guide member. The shelf is in a form of a plate that extends as being orthogonal to a vertical direction of the housing, and the capacitor unit is carried on the shelf. The first guide member and the second guide member are provided on the shelf. The capacitor unit includes a capacitor, a base portion in a form of a plate with a mount surface on which the capacitor is mounted, and a locking member. The locking member includes a shaft portion to be inserted in a hole provided in the mount surface and a head portion exposed on the outside of the hole. The locking member is constructed such that a height of the head portion is variable in the vertical direction by change of an engagement position where the shaft portion is engaged with the hole. The first guide member and the second guide member are constructed to guide a first end and a second end of the base portion in a lateral direction orthogonal to the vertical direction, respectively, along an anteroposterior direction orthogonal to the vertical direction and the lateral direction. The hole is located between the capacitor and the first end in the lateral direction and arranged at a position more distant from the opening than the first guide member in the anteroposterior direction. At a first engagement position where the head portion comes in contact with the mount surface, the locking member abuts on the first guide member. At a second engagement position where a lower end of the head portion is higher than an upper end of the first guide member, abutment of the locking member on the first guide member is canceled.

Advantageous Effects of Invention

According to the present disclosure, a power conversion device capable of preventing a capacitor unit from dropping during works for removing the capacitor unit and capable of removing restrictions in arrangement of the capacitor unit within a housing can be provided.

DESCRIPTION OF EMBODIMENTS

Figure 1:
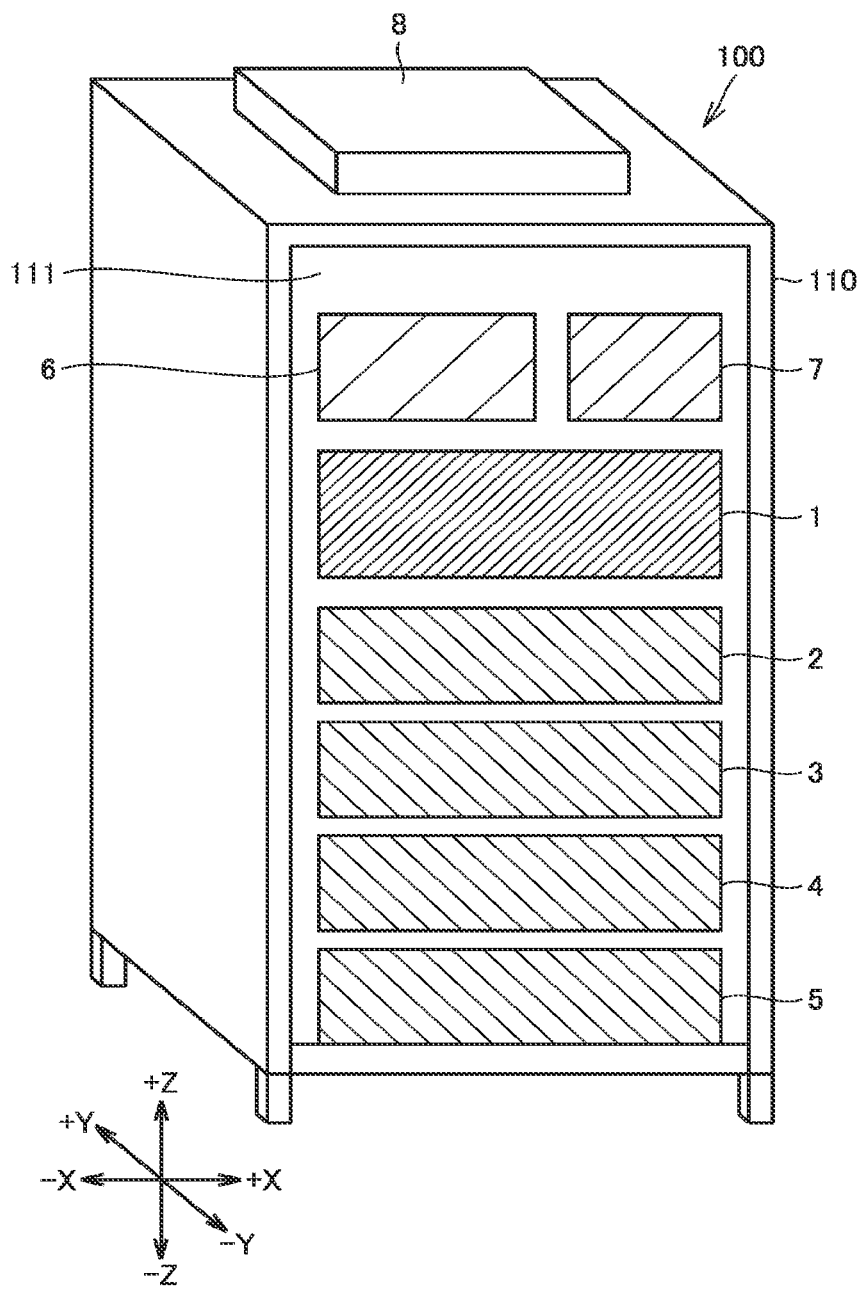
FIG. 1 is a schematic external view showing an exemplary construction of a power conversion device according to an embodiment.

An embodiment of the present invention will be described in detail below with reference to the drawings. The same or corresponding elements in the drawings have the same reference characters allotted below and description thereof will not be repeated in principle.

Exemplary Construction of Power Conversion Device

FIG. 1 is a schematic external view showing an exemplary construction of a power conversion device according to an embodiment. The power conversion device according to the present embodiment can representatively be applied to an uninterruptible power supply 100. Uninterruptible power supply 100 supplies a load (not shown) with alternating-current (AC) power supplied from an AC power supply such as a commercial power supply in an ordinary (normal) operation. When the AC power supply fails, uninterruptible power supply 100 supplies the load with direct-current (DC) power supplied from a power storage device (not shown).

As shown in FIG. 1, uninterruptible power supply 100 includes a housing 110 in a form of a board (a shape of a rectangular parallelepiped) 110, a plurality of units 1 to 7, and a fan 8. In the description below, a lateral direction when housing 110 is viewed from a front side is defined as an X-axis direction, an anteroposterior direction is defined as a Y-axis direction, and a vertical direction is defined as a Z-axis direction. A +X direction refers to a direction toward the right along the X-axis direction, and a −X direction refers to a direction opposite to the +X direction. A +Y direction refers to a direction from a front surface to a rear surface of uninterruptible power supply 100, and a −Y direction refers to a direction opposite to the +Y direction. A +Z direction refers to a direction upward along the Z-axis direction, and a −Z direction refers to a direction opposite to the +Z direction.

A plurality of units 1 to 7 are accommodated in housing 110. Housing 110 includes an opening 111 that opens in the −Y direction and a front cover (not shown) that covers opening 111. The front cover is provided to open and close opening 111. The front cover is provided with a ventilation port for introduction of air outside housing 110 into housing 110.

The plurality of units 1 to 7 are each substantially in a shape of a rectangular parallelepiped, and they are stacked at a distance from each other in the Z-axis direction. The plurality of units 1 to 7 include a capacitor unit 1 including a capacitor and element units 2 to 7 including elements other than the capacitor. Element units 2 to 7 include a chopper circuit 2, power converters (which are also referred to as "converter units" below) 3 to 5, a control device 6, and a circuit breaker unit 7. A construction of capacitor unit 1 and element units 2 to 7 will be described later.

The plurality of units 1 to 7 are inserted into housing 110 from the outside of housing 110 through opening 111. Each of the plurality of units 1 to 7 is provided as being insertable and removable in the Y-axis direction so as to facilitate maintenance and replacement with a new unit.

Fan 8 is arranged in an upper surface of housing 110. Fan 8 suctions air in the inside of housing 110 and exhausts suctioned air to the outside of housing 110. Air is thus introduced in housing 110 through an air vent in the front cover of housing 110, and heat radiation from the plurality of units 1 to 7 is accelerated by passage of introduced air by the plurality of units 1 to 7. Air warmed by passage by the plurality of units 1 to 7 is exhausted to the outside of housing 110.

Figure 2:
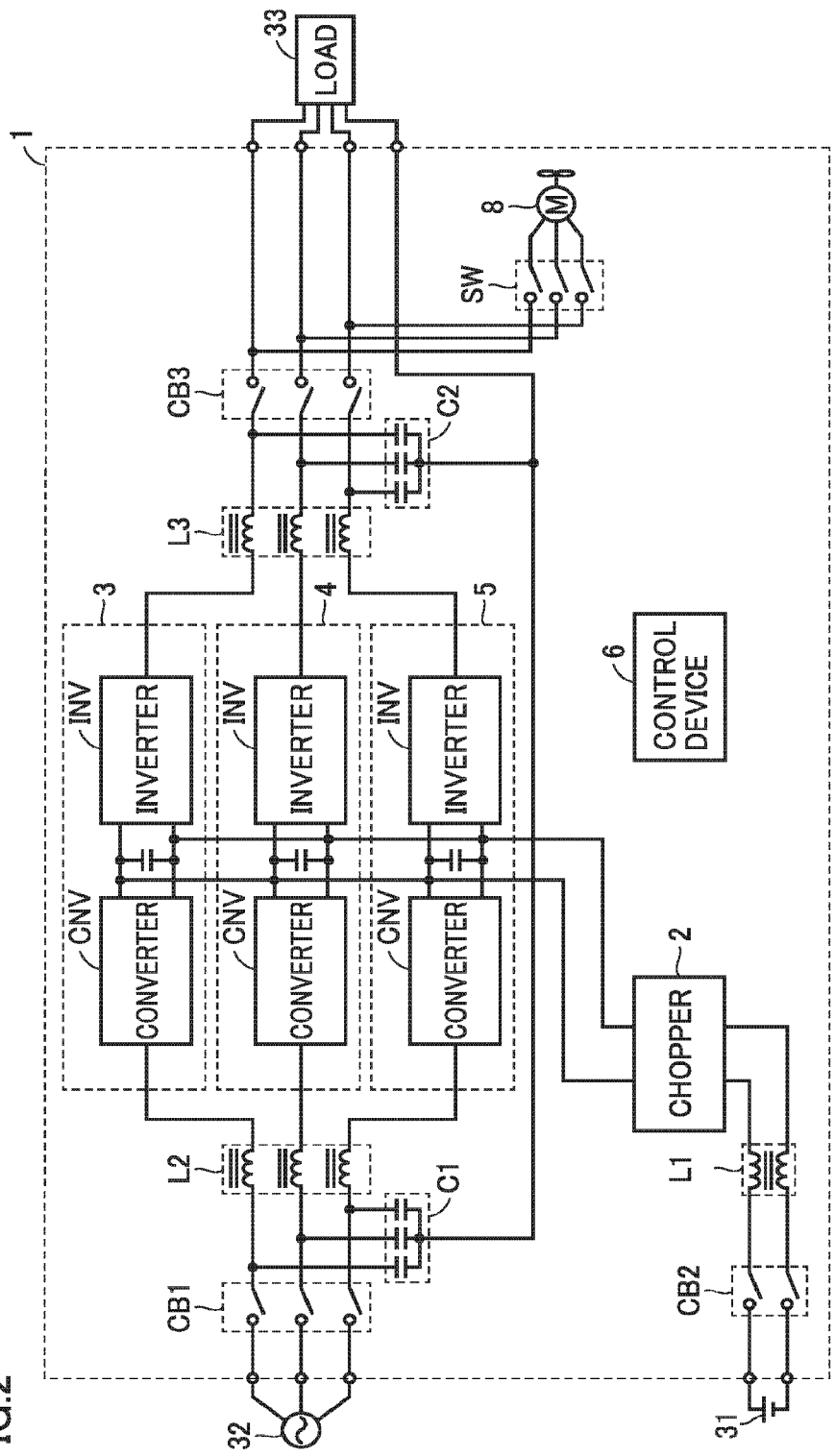
FIG. 2 is a circuit diagram showing a configuration of an uninterruptible power supply.

FIG. 2 is a circuit diagram showing a configuration of uninterruptible power supply 100.

As shown in FIG. 2, uninterruptible power supply 100 includes chopper circuit 2, capacitor units 3 to 5, control device 6, fan 8, capacitors C1 and C2, circuit breakers CB1 to CB3, reactors L1 to L3, and a switch SW. Uninterruptible power supply 100 is connected to a power storage device 31. Uninterruptible power supply 100 is connected to an AC power supply 32 in a three-phase three-wire system and connected to a load 33 in a three-phase four-wire system.

Capacitor units 3 to 5 are provided in correspondence with the U phase, the V phase, and the W phase, respectively. Each of capacitor units 3 to 5 includes a converter CNV and an inverter INV.

Three-phase AC power provided from AC power supply 32 is provided to capacitor units 3 to 5 for respective phases sequentially through circuit breaker CB1 and reactor L2. Capacitor units 3 to 5 each convert input three-phase AC power into DC power and convert DC power into three-phase AC power to be supplied to load 33. Capacitor units 3 to 5 each provide resultant three-phase AC power to load 33 and fan 8 sequentially through reactor L3 and circuit breaker CB3. Switch SW is provided on an input side of fan 8.

Each phase on the input side of uninterruptible power supply 100 is connected to a neutral point on an output side of uninterruptible power supply 100 with capacitor C1 being interposed. Each phase on the output side of uninterruptible power supply 100 is connected to a neutral point on the output side of uninterruptible power supply 100 with capacitor C2 being interposed.

Energy for supply of electric power on the occurrence of failure of AC power supply 32 is stored in power storage device 31. When AC power supply 32 fails, DC power provided from power storage device 31 is supplied to chopper circuit 2 sequentially through circuit breaker CB2 and reactor L1.

Chopper circuit 2 boosts a DC voltage provided from power storage device 31 and supplies DC power to a DC link of each of capacitor units 3 to 5. In charging power storage device 31, chopper circuit 2 operates to charge power storage device 31 with DC power provided from the DC links of capacitor units 3 to 5.

Chopper circuit 2 and each of capacitor units 3 to 5 each include an electric circuit composed of a switching element such as an insulated gate bipolar transistor (IGBT).

Control device 6 controls operations of the entire uninterruptible power supply 100. Control device 6 detects whether or not AC power supply 32 has failed and controls operations of chopper circuit 2 and capacitor units 3 to 5 in accordance with a result of detection. Control device 6 further controls on and off of circuit breakers CB1 to CB3 and switch SW.

Capacitors C1 and C2 are accommodated in capacitor unit 1 shown in FIG. 1. Though not shown, reactors L1 to L3 are provided in the inside of housing 110, in a space on a rear surface side in a space where capacitor units 3 to 5 are mounted. Circuit breakers CB1 to CB3 are accommodated in circuit breaker unit 7 shown in FIG. 1.

In the example in FIG. 1, V-phase capacitor unit 4 is provided above W-phase capacitor unit 5, U-phase capacitor unit 3 is provided above V-phase capacitor unit 4, and chopper circuit 2 is provided above U-phase capacitor unit 3.

Capacitor unit 1 is provided above chopper circuit 2. Control device 6 and circuit breaker unit 7 are provided above capacitor unit 1.

Figure 3:
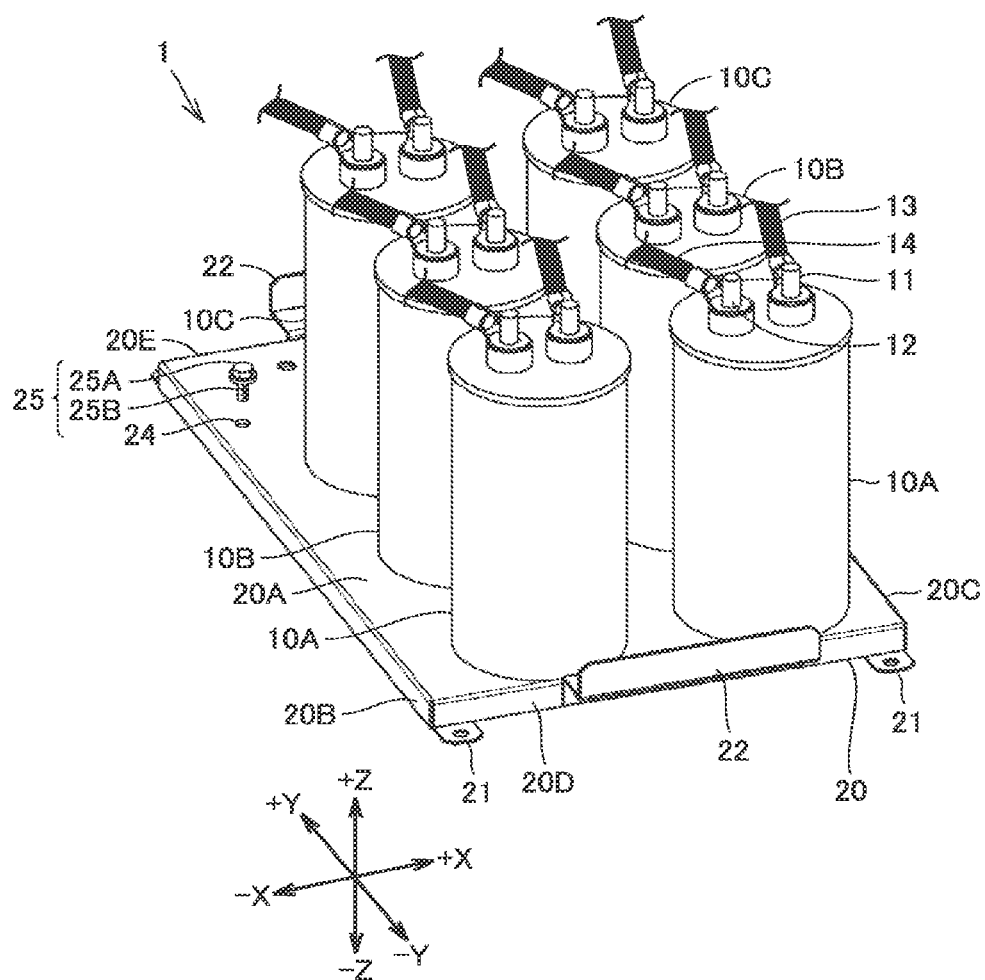
FIG. 3 is an external view of a capacitor unit.

Though FIG. 1 shows an exemplary construction in which chopper circuit 2, capacitor units 3 to 5, control device 6, and circuit breaker unit 7 shown in FIG. 2 are mounted as element units 2 to 7, other than these, an element and a device included in the electric circuit shown in FIG. 3 are also mounted in uninterruptible power supply 100.

Exemplary Construction of Capacitor Unit

FIG. 3 is an external view of capacitor unit 1 shown in FIG. 1. The external view in FIG. 3 is a perspective view of capacitor unit 1 from a front surface side of housing 110.

As shown in FIG. 3, capacitor unit 1 includes a plurality of capacitors 10, a base portion 20, a fillet portion 21, a handle portion 22, and a locking member 25. The plurality of capacitors 10 include capacitors C1 and C2 shown in FIG. 2.

Base portion 20 is in a form of a rectangular flat plate. Base portion 20 includes a mount surface 20A on which the plurality of capacitors 10 are mounted, ends 20B and 20C in the X-axis direction (lateral direction), and ends 20D and 20E in the Y-axis direction (anteroposterior direction).

Each of the plurality of capacitors 10 includes a cylindrical portion and a positive terminal 11 and a negative terminal 12 provided at one end of the cylindrical portion. Capacitor 10 is mounted on mount surface 20A such that terminals 11 and 12 are located at the upper end.

A first end of a wiring member 13 is connected to positive terminal 11. A first end of a wiring member 14 is connected to negative terminal 12. A second end (not shown) of wiring member 13 is connected to a main wire that electrically connects AC power supply 32 or load 33 to capacitor units 3 to 5. A second end (not shown) of wiring member 14 is connected to a neutral point on the output side of uninterruptible power supply 100.

The plurality of capacitors 10 are arranged on mount surface 20A as being aligned in the X-axis direction and the Y-axis direction. In the example in FIG. 3, six capacitors 10 in total are arranged as being aligned along the Y-axis direction in three rows. In the description below, two capacitors 10 arranged in a foremost row (a first row) of the three rows are also referred to as a "first capacitor 10A," two capacitors arranged in a second row are also referred to as a "second capacitor 10B," and two capacitors 10 arranged in a rearmost row (a third row) are also referred to as a "third capacitor 10C."

At end 20D in the −Y direction of base portion 20, two fillet portions 21 and handle portion 22 are provided. Two fillet portions 21 are arranged at a distance from each other in the X-axis direction. Handle portion 22 is arranged in a central portion in the X-axis direction of end 20D. The number of fillet portions 21 is not limited to two. The number of handle portions 22 is not limited to one.

Fillet portion 21 is in a form of a flat plate and protrudes in the −Y direction from end 20D. A through hole that passes through fillet portion 21 in a direction of thickness is provided in fillet portion 21. The number of through holes is not limited to one.

Handle portion 22 protrudes in the −Y direction from end 20D. As a worker pushes handle portion 22 along the +Y direction, capacitor unit 1 can be inserted in housing 110. As the worker pulls handle portion 22 along the −Y direction, capacitor unit 1 can be taken out of housing 110.

Handle portion 22 is provided also at end 20E in the +Y direction of base portion 20, similarly to end 20D. Two handle portions 22 can be used as handle portions for conveyance.

A hole 24 that opens in mount surface 20A is provided in base portion 20. Hole 24 extends in the Z-axis direction from mount surface 20A. Hole 24 may be a through hole that passes through a flat plate portion where mount surface 20A is provided in the Z-axis direction or a hole with bottom provided at a prescribed depth from mount surface 20A.

Hole 24 is located between end 20B of base portion 20 and capacitor 10 in the X-axis direction. A position where hole 24 is arranged will be described later in further detail.

Locking member 25 is attached to mount surface 20A by being inserted in hole 24. Locking member 25 includes a shaft portion to be inserted in hole 24 and a head portion exposed on the outside of hole 24. Locking member 25 is, for example, a bolt member including a head portion 25A and a male thread portion 25B. Head portion 25A is larger in diameter than male thread portion 25B. Head portion 25A has a tip end in a hexagonal shape on which a wrench can be hooked.

Hole 24 is in an open shape corresponding to male thread portion 25B, and an inner surface thereof is provided with a female thread portion to be screwed to male thread portion 25B. By screwing male thread portion 25B to the female thread portion of hole 24, locking member 25 can be attached to mount surface 20A.

By turning locking member 25 with male thread portion 25B being defined as an axis of rotation center while locking member 25 is attached to mount surface 20A, a screwing position where male thread portion 25B and the female thread portion of hole 24 are screwed to each other is varied. With a distance from mount surface 20A in the +Z direction being defined as a "height", the height of head portion 25A of locking member 25 can be varied by varying the screwing position where male thread portion 25B and the female thread portion are screwed to each other.

[Method of Removing Capacitor Unit 1]

A method of removing capacitor unit 1 from housing 110 will now be described with reference to FIGS. 4 to 7. The method described below is performed in a scene of maintenance of capacitor unit 1 or a scene of replacement of capacitor unit 1 with a new one.

Figure 4:
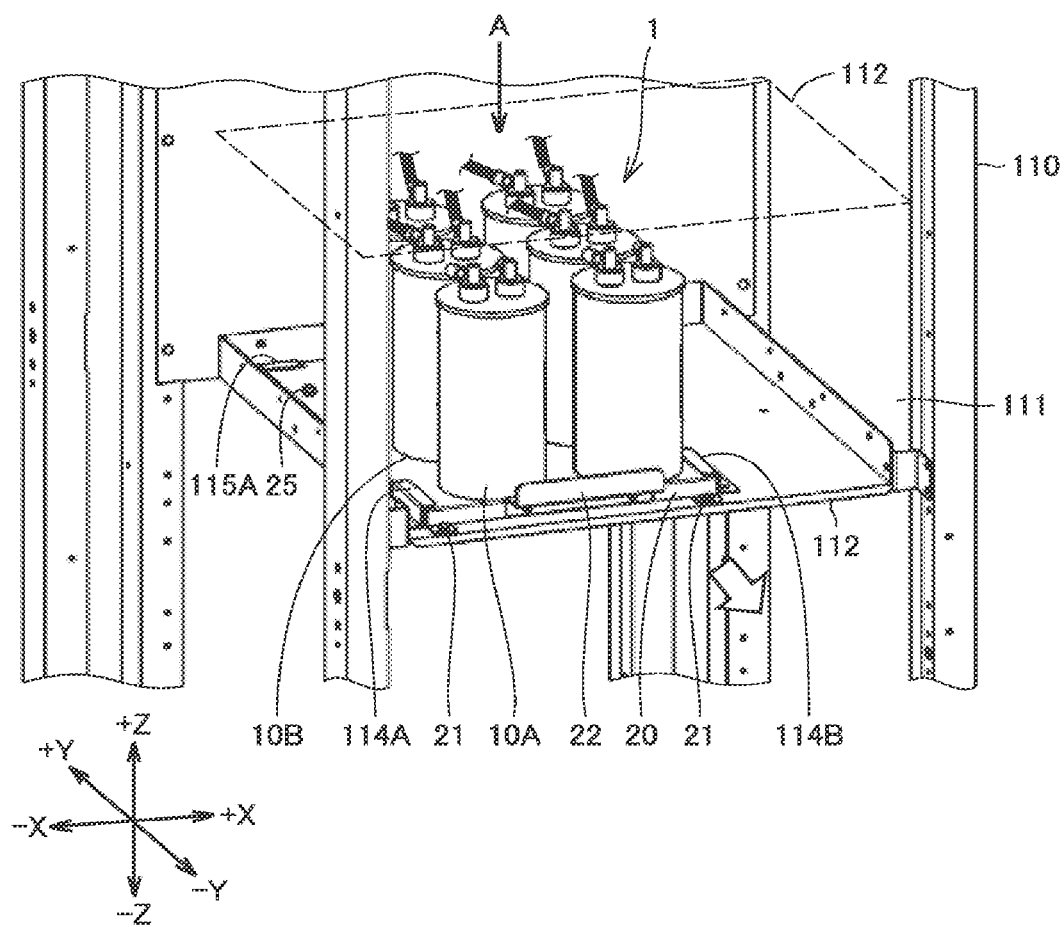
FIG. 4 is a partial perspective view showing a state that the capacitor unit is accommodated in a housing.
Figure 5:
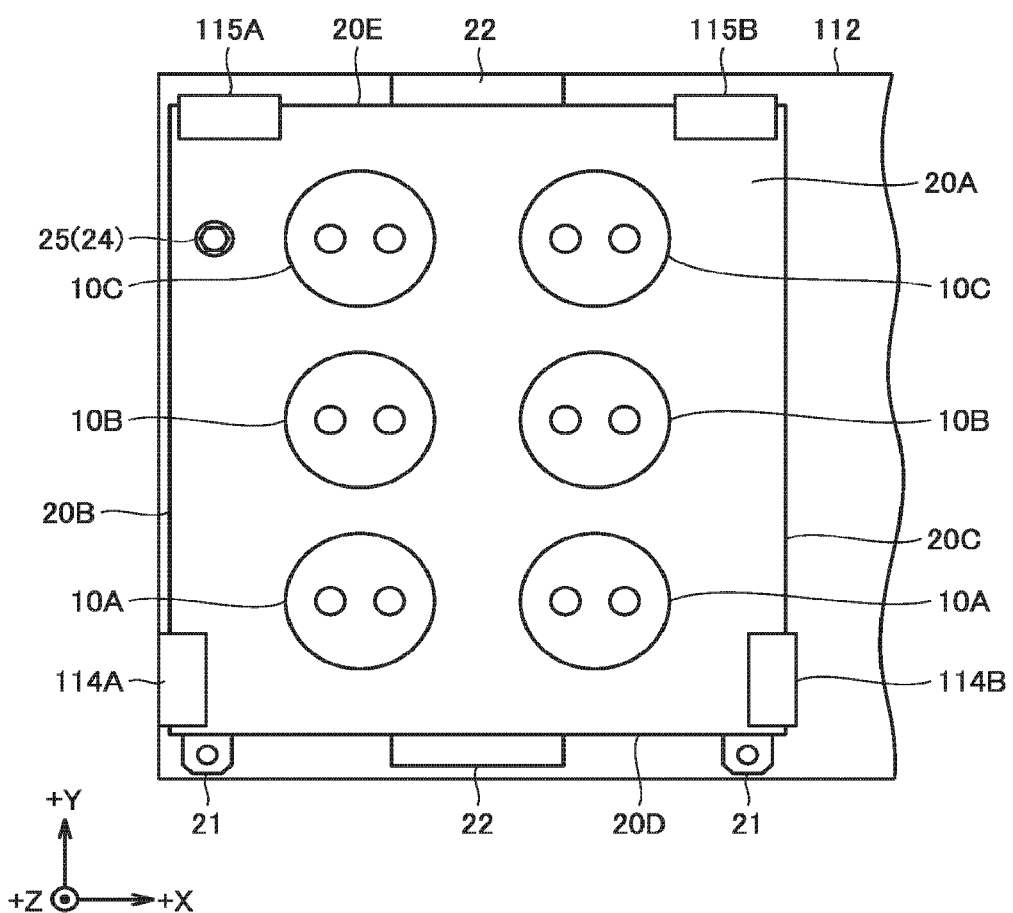
FIG. 5 is a view of the capacitor unit in FIG. 4 in a direction shown with an arrow A.

FIG. 4 is a partial perspective view showing a state that capacitor unit 1 is accommodated in housing 110. FIG. 5 is a view of capacitor unit 1 in FIG. 4 in a direction shown with an arrow A.

As shown in FIG. 4, capacitor unit 1 is carried on a shelf 112 provided in the inside of housing 110. Shelf 112 is in a form of a flat plate along the X-axis direction and the Y-axis direction.

Though not shown, a plurality of shelves 112 are provided in the inside of housing 110. The plurality of shelves 112 are arranged individually in the Z-axis direction. Capacitor unit 1 and element units 2 to 7 shown in FIG. 2 are carried individually on the plurality of shelves 112. Therefore, the element unit (control device 6 and circuit breaker unit 7) is carried on shelf 112 arranged above capacitor unit 1.

As shown in FIG. 5, capacitor unit 1 is fixed to the upper surface of shelf 112. Shelf 112 includes guide members 114A and 114B and holding members 115A and 115B. Guide members 114A and 114B and holding members 115A and 115B are attached to the upper surface of shelf 112.

Guide members 114A and 114B and holding members 115A and 115B are members for positioning on shelf 112, capacitor unit 1 to be carried on shelf 112. Specifically, guide member 114A is provided in correspondence with end 20B of base portion 20, and guide member 114B is provided in correspondence with end 20C of base portion 20. Guide members 114A and 114B are arranged in proximity to opening 111 in housing 110. Holding members 115A and 115B are constructed to hold end 20E of base portion 20 in the Z-axis direction. Holding members 115A and 115B are arranged at a distance from each other in the X-axis direction. The number of holding members is not limited to two.

As two fillet portions 21 are fastened to shelf 112 with a fastening member represented by a bolt while base portion 20 is positioned on shelf 112 by guide members 114A and 114B and holding members 115A and 115B, capacitor unit 1 is fixed to shelf 112.

In the state shown in FIG. 4, locking member 25 has been attached to mount surface 20A. Male thread portion 25B of locking member 25 has been inserted in hole 24 provided in mount surface 20A. Hole 24 is arranged at a position more distant from opening 111 than guide member 114A in the Y-axis direction. At this time, the screwing position where male thread portion 25B and the female thread portion of hole 24 are screwed to each other is adjusted such that head portion 25A of locking member 25 is in contact with mount surface 20A. The screwing position at this time corresponds to one embodiment of the "first engagement position."

In removing capacitor unit 1 from housing 110 in the state in FIG. 4, a worker should do works for releasing capacitor unit 1 from shelf 112, works for removing wiring members 13 and 14 connected to respective terminals 11 and 12 of the plurality of capacitors 10 included in capacitor unit 1, and works for drawing capacitor unit 1 out of housing 110.

Since shelf 112 on which element units 6 and 7 are carried is located above capacitor unit 1, works for removing wiring members 13 and 14 from terminals 11 and 12 of second capacitor 10B and third capacitor 10C in the rear in the state shown in FIG. 4 are not easy. Therefore, the worker should do works for removing wiring members 13 and 14 from second capacitor 10B and third capacitor 10C during intervals between works for drawing capacitor unit 1 out of housing 110.

When weight balance in the anteroposterior direction of base portion 20 is lost during the works for removing wiring members 13 and 14, however, capacitor unit 1 may drop from shelf 112. Alternatively, when the worker inadvertently strongly pulls handle portion 22 of capacitor unit 1 forward (the -Y direction) during the works, capacitor unit 1 may drop from shelf 112.

Then, the present embodiment provides a construction of a power conversion device that prevents capacitor unit 1 from dropping from shelf 112 and allows works for removing capacitor unit 1 to be done in a stable manner. An operation procedure in works for removing capacitor unit 1 will be described in detail below.

Initially, in the state shown in FIG. 4, wiring members 13 and 14 are removed from terminals 11 and 12 of first capacitor 10A in front.

Then, the fastening members with which two fillet portions 21 are fastened to shelf 112 are removed. When handle portion 22 is pulled forward along the -Y direction in this state, base portion 20 of capacitor unit 1 is slid in the -Y direction with respect to shelf 112. Guide members 114A and 114B guide base portion 20 along the Y-axis direction. Capacitor unit 1 can thus be drawn out through opening 111 along the -Y direction.

Base portion 20 is slid along the -Y direction as far as a position where second capacitor 10B is in proximity to opening 111. Wiring members 13 and 14 are removed from respective terminals 11 and 12 of second capacitor 10B in this state.

Figure 6:
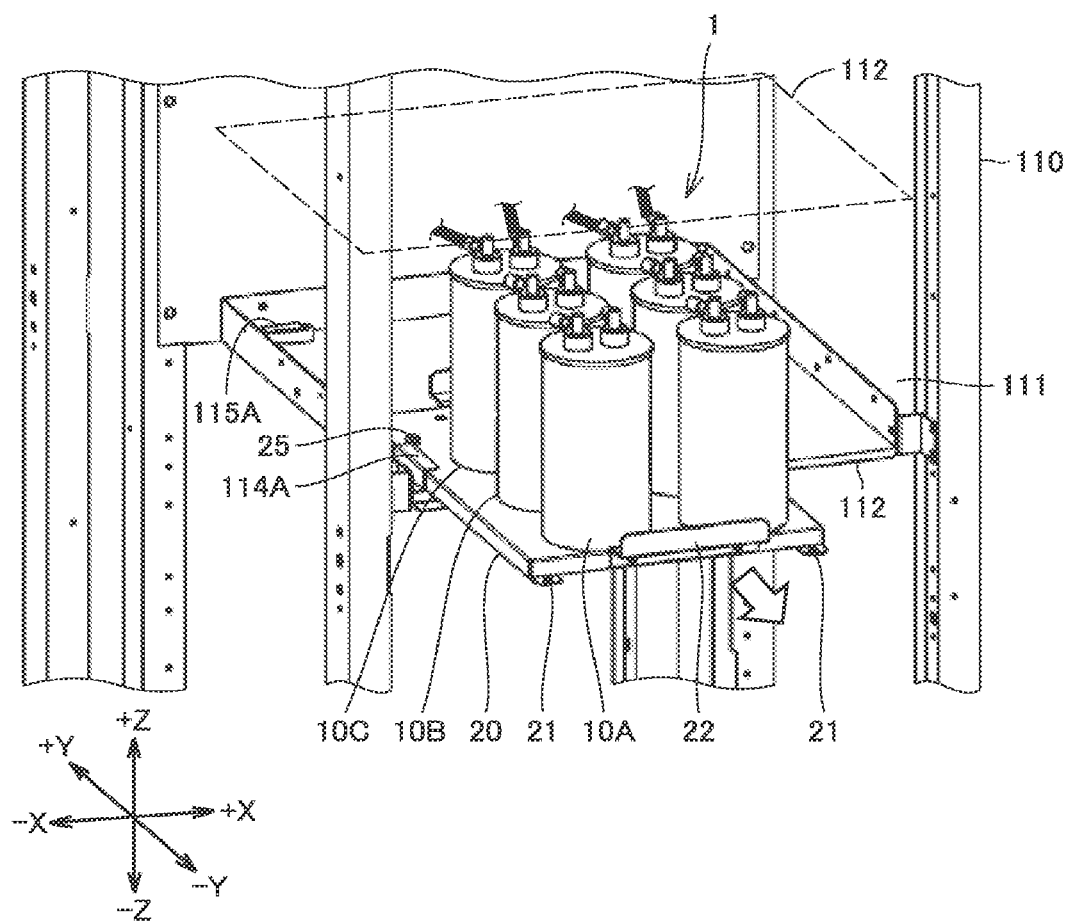
FIG. 6 is a partial perspective view showing a state that the capacitor unit is drawn out through the opening of the housing.

Then, base portion 20 is slid along the -Y direction as far as a position where third capacitor 10C is in proximity to opening 111. FIG. 6 is a partial perspective view showing a state that capacitor unit 1 is drawn out through opening 111 of housing 110.

As handle portion 22 is pulled forward along the -Y direction, locking member 25 attached to mount surface 20A of base portion 20 is also moved along the -Y direction. As base portion 20 is slid in the -Y direction by a prescribed length from the state in FIG. 4, head portion 25A of locking member 25 abuts on an end in the +Y direction of guide member 114A. Movement of base portion 20 along the -Y direction is thus restricted. In other words, locking member 25 can function as a stopper that restricts movement of base portion 20 in the -Y direction.

Capacitor unit 1 is thus fixed to shelf 112 while ends 20B and 20C of base portion 20 are supported by guide members 114A and 114B. Therefore, as shown in FIG. 6, capacitor unit 1 can be kept held without dropping while a part of base portion 20 is drawn out through opening 111. Consequently, works for removing wiring members 13 and 14 from terminals 11 and 12 of third capacitor 10C can be done in a stable manner. In addition, capacitor unit 1 can be prevented from dropping from shelf 112 when the worker inadvertently strongly pulls handle portion 22 forward.

After the works for removing wiring members 13 and 14 from terminals 11 and 12 of third capacitor 10C are finished, head portion 25A is turned by hooking a tool such as a wrench on a tip end of head portion 25A of locking member 25. At this time, the screwing position where male thread portion 25B and the female thread portion of hole 24 are screwed to each other is changed such that the lower end of head portion 25A is higher than the upper end of guide member 114A. The screwing position at this time corresponds to one embodiment of the "second engagement position."

Figure 7:
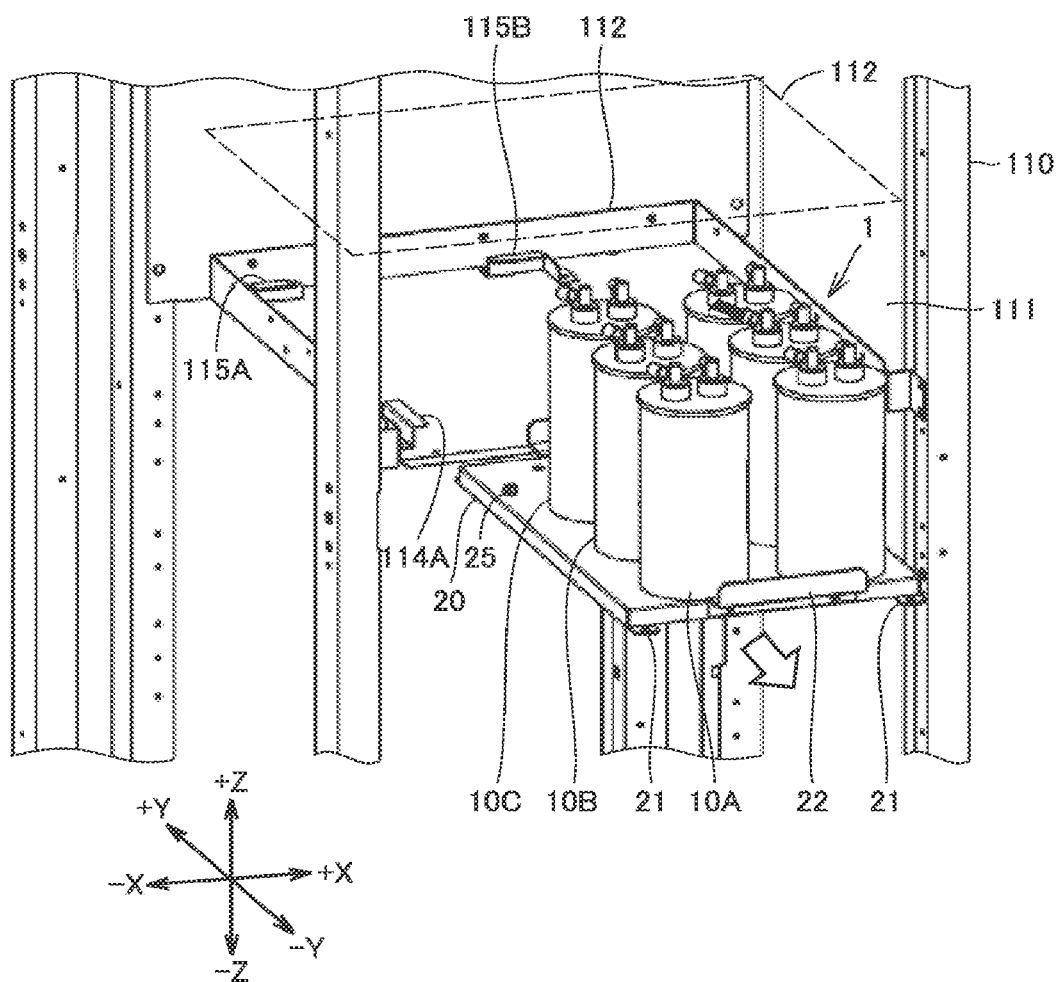
FIG. 7 is a partial perspective view showing a state that the capacitor unit has been removed from the housing.

When the lower end of head portion 25A becomes higher than the upper end of guide member 114A, abutment of head portion 25A and guide member 114A on each other is canceled and movement of base portion 20 in the -Y direction is permitted. Therefore, by pulling handle portion 22 forward along the -Y direction, capacitor unit 1 can be removed from housing 110. FIG. 7 is a partial perspective view showing a state that capacitor unit 1 has been removed from housing 110.

Figure 8:
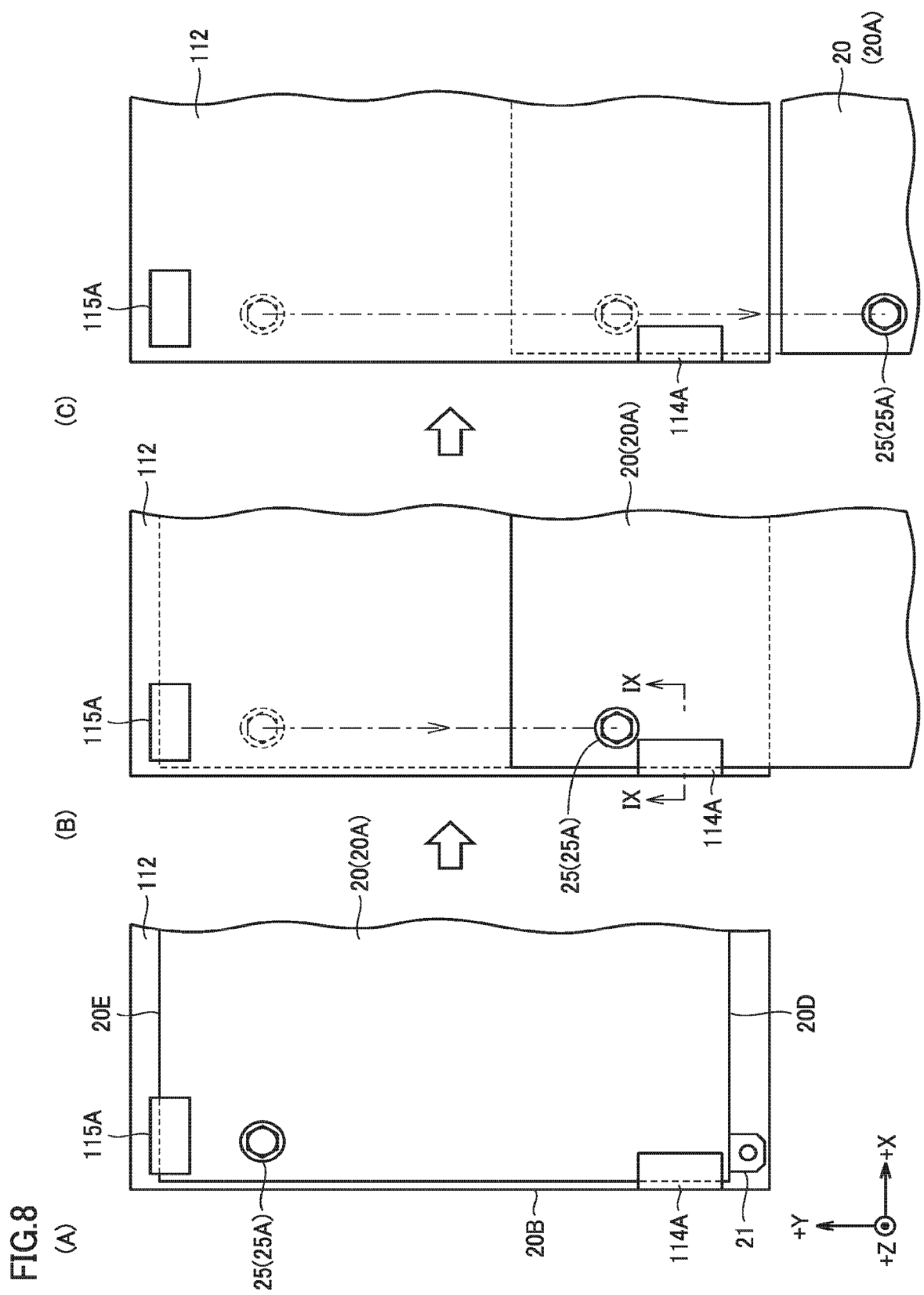
FIG. 8 is a partial schematic diagram of a base portion and a shelf.

Functions of locking member 25 in works for removing capacitor unit 1 will now be described with reference to FIGS. 8 and 9. FIG. 8 (A) to (C) is a partial schematic diagram of base portion 10 and shelf 112.

FIG. 8 (A) is a top view of base portion 20 and shelf 112 in the state shown in FIG. 4. In FIG. 8 (A), the screwing position where male thread portion 25B of locking member 25 and the female thread portion of hole 24 are screwed to each other (first engagement position) is adjusted such that head portion 25A of locking member 25 is in contact with mount surface 20A of base portion 20.

FIG. 8 (B) is a top view of base portion 20 and shelf 112 in the state shown in FIG. 6. By sliding base portion 20 in the -Y direction from the state in FIG. 8 (A), locking member 25 comes closer to guide member 114A as shown with an arrow in the figure.

Figure 9:
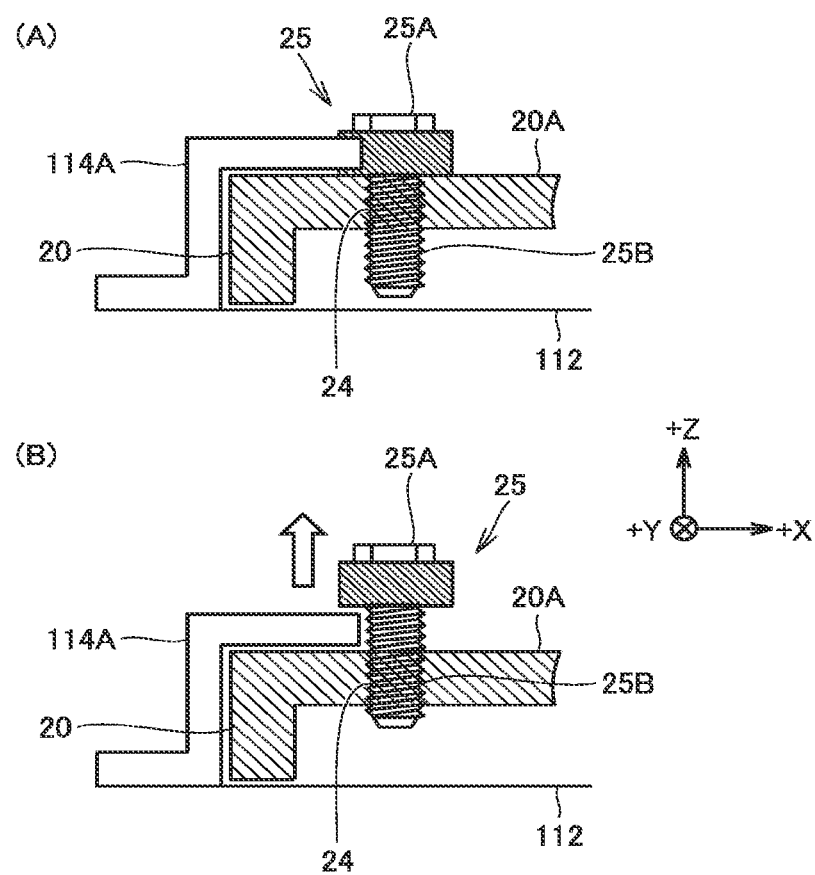
FIG. 9 is a cross-sectional view along the line IX-IX shown in FIG. 8 (B).

FIG. 9 (A) is a cross-sectional view along the line IX-IX shown in FIG. 8 (B). Locking member 25 is arranged at such a position that head portion 25A overlaps with guide member 114A in a plan view in the +Y direction while head portion 25A is in contact with mount surface 20A. Therefore, head portion 25A abuts on guide member 114A while base portion 20 is slid, and sliding of base portion 20 is restricted. Since capacitor unit 1 is thus prevented from dropping from shelf 112, works for removing wiring members 13 and 14 from terminals 11 and 12 of third capacitor 10C can be done in a stable manner as shown in FIG. 6.

In FIG. 9 (B), the screwing position where male thread portion 25B and the female thread portion are screwed to each other (second engagement position) is changed from the state in FIG. 9 (A). By setting the lower end of head portion 25A to be higher than the upper end of guide member 114A, abutment of head portion 25A and guide member 114A on each other is canceled.

In the plan view in the +Y direction, male thread portion 25B is not superimposed on guide member 114A. Therefore, male thread portion 25B does not abut on guide member 114A. Therefore, base portion 20 can be slid in the −Y direction.

FIG. 8 (C) is a top view of base portion 20 and shelf 112 in the state shown in FIG. 7. Since base portion 20 can be slid along the −Y direction, capacitor unit 1 can be removed from housing 110.

Though not shown, in inserting capacitor unit 1 into housing 110, works for fixing capacitor unit 1 to shelf 112, works for connecting wiring members 13 and 14 to terminals 11 and 12 of the plurality of capacitors 10A to 10C included in capacitor unit 1, and works for pushing capacitor unit 1 into housing 110 are done in a procedure reverse to the operation procedure in the removal works described above.

Specifically, in the works for inserting capacitor unit 1 into housing 110, initially, the screwing position where male thread portion 25B and the female thread portion of hole 24 are screwed to each other is adjusted such that the height of head portion 25A of locking member 25 is equal to or higher than a predetermined height. The height of head portion 25A at this time is set such that the lower end of head portion 25A is higher than the upper end of guide member 114A with base portion 20 being carried on shelf 112, in order to avoid abutment of head portion 25A and guide member 114A on each other in sliding base portion 20 along the +Y direction.

Then, capacitor unit 1 is inserted through opening 111 from a side of end 20E. At this time, base portion 20 is inserted through opening 111 such that ends 20B and 20C are located on the inner side of guide members 114A and 114B, respectively.

Then, as handle portion 22 is pushed in the +Y direction, base portion 20 is slid in the +Y direction with respect to shelf 112. Guide members 114A and 114B guide base portion 20 along the Y-axis direction.

Since head portion 25A and guide member 114A do not abut on each other, locking member 25 passes by guide member 114A and moves along the +Y direction. As locking member 25 passes by guide member 114A, the screwing position where male thread portion 25B and the female thread portion of hole 24 are screwed to each other is changed (first engagement position) such that head portion 25A is in contact with mount surface 20A. Thus, even when base portion 20 moves in the −Y direction, head portion 25A abuts on guide member 114A and sliding of base portion 20 is restricted. Therefore, capacitor unit 1 can be prevented from dropping from shelf 112.

During intervals between sliding movements of base portion 20 in the +Y direction, wiring members 13 and 14 are connected to terminals 11 and 12 of third capacitor 10C and second capacitor 10B. Furthermore, while end 20E of base portion 20 is held in the Z-axis direction by holding members 115A and 115B, wiring members 13 and 14 are connected to terminals 11 and 12 of first capacitor 10A. As two fillet portions 21 are fastened to base portion 20 with the fastening members, capacitor unit 1 is fixed to shelf 112.

As described above, in the power conversion device according to the present embodiment, the capacitor unit can be prevented from dropping from the shelf during works for removing the capacitor unit from the housing through the opening that opens in the anteroposterior direction. Therefore, works for removing the wiring members from a plurality of capacitors included in the capacitor unit can be done in a stable manner.

Furthermore, since the capacitor unit can be prevented from dropping from the shelf also during works for inserting the capacitor unit into the housing, works for connecting the wiring members to the plurality of capacitors included in the capacitor unit can be done in a stable manner.

In a conventional power conversion device, from a point of view of ease in works for removing wiring members from a plurality of capacitors, a method of accommodating a capacitor unit around a ceiling of a housing and removing the wiring members from the plurality of capacitors through an opening provided in the ceiling has been adopted. With this method, the capacitor unit can be taken out of a front side of the housing after all wiring members are removed.

With this method, however, a position of arrangement of the capacitor unit is restricted and hence a degree of freedom in arrangement of a plurality of units in the inside of the housing is lowered. Thus, there is a concern about difficulty in reduction in size of the housing. Furthermore, the wiring member connected to the capacitor is longer in length due to arrangement of the capacitor unit around the ceiling, and hence harmonic noise superimposed on a voltage or a current may increase.

In the power conversion device according to the present embodiment, as shown in FIG. 1, even when an element unit is arranged as being stacked above the capacitor unit, works for removing the capacitor unit can be done in a stable manner without drop of the capacitor unit. Therefore, arrangement of the plurality of units in the inside of the housing is not restricted by the capacitor unit. Since the wiring member connected to the capacitor can be shorter, increase in harmonic noise can be suppressed.

[Modification]

Though an exemplary construction in which locking member 25 is arranged between end 20B and capacitor 10 in the −X direction of base portion 20 is described in the embodiment above, locking member 25 may be arranged between end 20C and capacitor 10 in the +X direction of base portion 20.

Figure 10:
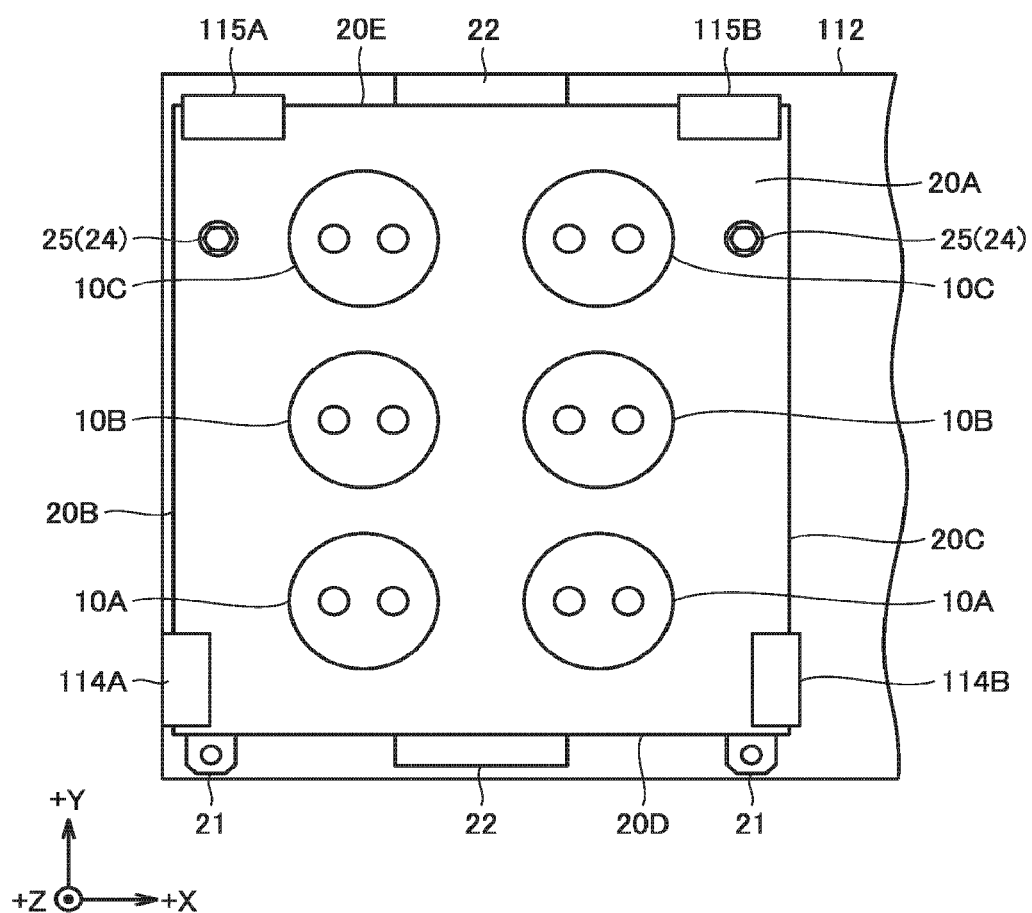
FIG. 10 is a top view of a capacitor unit according to a modification of the embodiment.

The number of locking members 25 to be attached to base portion 20 is not limited to one. For example, as shown in FIG. 10, locking member 25 may further be arranged between end 20C and capacitor 10 in the +X direction. Two locking members 25 are equidistant from opening 111 in the Y-axis direction.

In the exemplary construction shown in FIG. 10, when base portion 20 is slid along the −Y direction in works for removing capacitor unit 1, two locking members 25 abut on respective guide members 114A and 114B. Therefore, sliding of base portion 20 is restricted. Therefore, an effect as in the embodiment described above can be achieved.

Though an exemplary construction in which a bolt member including head portion 25A and male thread portion 25B is employed as locking member 25 is described in the embodiment above, locking member 25 is not limited to the bolt member. Locking member 25 should only include a head portion and a shaft portion and should only be constructed as being variable in height of the head portion depending on a position of engagement between hole 24 provided in mount surface 20A and the shaft portion. For example, a pin member may be employed as locking member 25. The pin member includes a head portion and a shaft portion. The head portion is larger in diameter than the shaft portion. By changing a position of engagement between the shaft portion and hole 24, the height of the head portion can be adjusted. Thus, an effect as in the embodiment described above can be achieved.

It should be understood that the embodiment disclosed herein is illustrative and non-restrictive in every respect. The scope of the present invention is defined by the terms of the claims rather than the description above and is intended to include any modifications within the scope and meaning equivalent to the terms of the claims.

REFERENCE SIGNS LIST 1 capacitor unit; 2 chopper circuit; 3 to 5 capacitor unit; 6 control device; 7 circuit breaker unit; 8 fan; 10, 10A to 10C capacitor; 11 positive terminal; 12 negative terminal; 13, 14 wiring member; 20 base portion; 20A mount surface; 21 fillet portion; 22 handle portion; 24 hole; 25 locking member; 25A head portion; 25B male thread portion; 31 power storage device; 32 AC power supply; 33 load; 100 uninterruptible power supply; 110 housing; 111 opening; 112 shelf; 114A, 114B guide member; 115A, 115B holding member; CB1 to CB3 circuit breaker; CNV converter; INV inverter; SW switch

The invention claimed is:

1. A power conversion device comprising:
a capacitor unit; and
a housing provided with an opening that opens toward front, the capacitor unit being removably accommodated in the housing through the opening, wherein
the housing includes
a shelf in a form of a plate that extends as being orthogonal to a vertical direction of the housing, the capacitor unit being carried on the shelf, and
a first guide member and a second guide member provided on the shelf,
the capacitor unit includes
a capacitor,
a base portion in a form of a plate with a mount surface on which the capacitor is mounted, and
a locking member including a shaft portion to be inserted in a hole provided in the mount surface and a head portion exposed on outside of the hole,
the locking member is constructed such that a height of the head portion is variable in the vertical direction by change of an engagement position where the shaft portion is engaged with the hole,
the first guide member and the second guide member are constructed to guide a first end and a second end of the base portion in a lateral direction orthogonal to the vertical direction, respectively, along an anteroposterior direction orthogonal to the vertical direction and the lateral direction,
the hole is located between the capacitor and the first end in the lateral direction and arranged at a position more distant from the opening than the first guide member in the anteroposterior direction,
at a first engagement position where the head portion comes in contact with the mount surface, the locking member abuts on the first guide member, and
at a second engagement position where a lower end of the head portion is higher than an upper end of the first guide member, abutment of the locking member on the first guide member is canceled.

2. The power conversion device according to claim 1, wherein
when the base portion is viewed two-dimensionally in the anteroposterior direction at the first engagement position, the head portion is arranged at a position where the head portion partially overlaps with the first guide member, and
when the base portion is viewed two-dimensionally in the anteroposterior direction at the second engagement position, the shaft portion is arranged at a position where the shaft portion is not superimposed on the first guide member.

3. The power conversion device according to claim 1, wherein
the locking member is a bolt member including the head portion and the shaft portion where a male thread portion is formed,
a female thread portion that can be screwed to the male thread portion is formed in an inner surface of the hole, and
the bolt member is constructed such that the height of the head portion is variable in the vertical direction by change of a screwing position where the male thread portion is screwed to the female thread portion.

4. The power conversion device according to claim 1, wherein
a plurality of capacitors are mounted on the mount surface as being aligned in the anteroposterior direction,
each of the capacitors includes a cylindrical portion and a terminal provided at an upper end of the cylindrical portion, and
the capacitor unit further includes a wiring member connected to the terminal of each capacitor.

5. The power conversion device according to claim 1, further comprising a plurality of element units, wherein
the capacitor unit and the plurality of element units are arranged in the housing at a distance in the vertical direction.

* * * * *